United States Patent
Ferrant et al.

(10) Patent No.: US 7,212,432 B2
(45) Date of Patent: May 1, 2007

(54) RESISTIVE MEMORY CELL RANDOM ACCESS MEMORY DEVICE AND METHOD OF FABRICATION

(75) Inventors: Richard Ferrant, Esquibien (FR); Daniel Braun, Paris (FR)

(73) Assignees: Infineon Technologies AG, Munich (DE); Altis Semiconductor, Corbeil Essonnes Cedex (FR)

( * ) Notice: Subject to any disclaimer, the term of this patent is extended or adjusted under 35 U.S.C. 154(b) by 168 days.

(21) Appl. No.: 10/955,837

(22) Filed: Sep. 30, 2004

(65) Prior Publication Data

US 2006/0067112 A1    Mar. 30, 2006

(51) Int. Cl.
G11C 11/00    (2006.01)

(52) U.S. Cl. ............... 365/158; 365/171; 365/173; 365/156; 365/103; 365/63

(58) Field of Classification Search ............ 365/158, 365/171, 173, 156, 103, 63
See application file for complete search history.

(56) References Cited

U.S. PATENT DOCUMENTS

| | | | |
|---|---|---|---|
| 6,034,882 A * | 3/2000 | Johnson et al. | 365/103 |
| 6,597,598 B1 * | 7/2003 | Tran et al. | 365/94 |
| 6,757,191 B2 * | 6/2004 | Ooishi et al. | 365/171 |
| 6,765,303 B1 * | 7/2004 | Krivokapic et al. | 257/347 |
| 6,816,405 B1 * | 11/2004 | Lu et al. | 365/171 |
| 6,879,513 B2 * | 4/2005 | Ooishi | 365/158 |
| 6,888,187 B2 * | 5/2005 | Brown et al. | 257/297 |
| 6,940,747 B1 * | 9/2005 | Sharma et al. | 365/158 |
| 6,969,656 B2 * | 11/2005 | Du et al. | 438/268 |
| 6,977,837 B2 * | 12/2005 | Watanabe et al. | 365/156 |
| 7,037,790 B2 * | 5/2006 | Chang et al. | 438/275 |
| 2004/0100306 A1 * | 5/2004 | Krivokapic et al. | 326/112 |
| 2005/0224890 A1 * | 10/2005 | Bernstein et al. | 257/371 |

* cited by examiner

Primary Examiner—Viet Q. Nguyen
(74) Attorney, Agent, or Firm—Dicke, Billig & Czaja, LLP

(57) ABSTRACT

A resistive memory cell random access memory device and method for fabrication. In one embodiment, the invention relates to a resistive memory cell random access memory device comprising a plurality of first current lines; a plurality of second current lines; a plurality of third current lines being formed as split current lines; and an array of resistive memory cells arranged in columns defined by said first current lines and rows defined by said third current lines, each resistive memory cell including a resistive memory element and an access transistor connected in series, each memory cell being connected between one of said first current lines and a reference potential, wherein said access transistors being FinFET-type field effect transistors, each one having two independent gates and a common floating body, and wherein each third current line being connected to one of said two independent gates of each one of the access transistors of a row of said array and being connected to one of said two independent gates of each one of the access transistors of an adjacent row of said array. It also relates to a method for its fabrication.

12 Claims, 3 Drawing Sheets

RESISTIVE MEMORY CELL RANDOM ACCESS MEMORY DEVICE AND METHOD OF FABRICATION

FIELD OF THE INVENTION

This invention is in the field of non-volatile semiconductor memory chips and more particularly, relates to a random access memory device having a resistive memory cell and a method for its fabrication.

BACKGROUND

Magnetic (or magneto-resistive) random access memory (MRAM) is a non-volatile access memory technology that could potentially replace the dynamic random access memory (DRAM) as the standard memory for computing devices. Particularly, the use of MRAM-devices as a non-volatile RAM will eventually allow for "instant on"-systems that come to life as soon as the computer system is turned on, thus saving the amount of time needed for a conventional computer to transfer boot data from a hard disk drive to volatile DRAM during system power up.

A magnetic memory cell (also referred to as a tunneling magneto-resistive or TMR-device) typically includes a structure having ferromagnetic layers separated by a non-magnetic layer (barrier) and arranged into a magnetic tunnel junction (MTJ). Digital information is stored and represented in the magnetic memory cell as directions of magnetization vectors in the ferromagnetic layers. More specifically, the magnetic moment of one ferromagnetic layer is magnetically fixed or pinned (also referred to as a "reference layer"), while the magnetic moment of the other ferromagnetic layer (also referred to as "free layer") is free to be switched between the same and opposite directions with respect to the fixed magnetization direction of the reference layer. The orientations of the magnetic moment of the free layer are also known as "parallel" and "antiparallel" states, respectively, wherein a parallel state refers to the same magnetic alignment of the free and reference layers, while an antiparallel state refers to opposing magnetic alignments therebetween.

Depending upon the magnetic states of the free layer (i.e., parallel or antiparallel states), the magnetic memory cell exhibits two different resistance values in response to a voltage applied across the magnetic tunnel junction barrier. The particular resistance of the TMR-device thus reflects the magnetization state of the free layer, wherein resistance is "low" when the magnetization is parallel, and "high" when the magnetization is antiparallel. Accordingly, a detection of changes in resistance allows a MRAM-device to provide information stored in the magnetic memory element, that is to say to read information from the magnetic memory element. In addition, a magnetic memory element typically is written to through the application of a bi-directional current in a particular direction, in order to magnetically align the free layer in a parallel or antiparallel state.

An magneto-resistive memory cell random access memory device (MRAM-device) integrates a plurality of magnetic memory cells and other circuits, such as a control circuit for magnetic memory cells, comparators for detecting states in a magnetic memory cell, input/output circuits and miscellaneous support circuitry. The magnetic memory cells are designed to be integrated into the back end wiring structure of back-end-of-line (BEOL) CMOS methoding following front-end-of-line (FEOL) CMOS methoding.

To be useful in present day electronic devices, very high density arrays of magnetic memory cells are utilized in magnetic random access memories. In these high density arrays the magnetic cells are generally arranged in rows and columns, with individual cells being addressable for reading and writing operations by the selection of an appropriate row and column containing the desired cell. Also conveniently, orthogonal current lines are provided, one for each row and one for each column so that a selected cell is written by applying current to the appropriate row current line and the appropriate column current line.

Recently, and especially in view of modern portable equipment, such as portable computers, digital still cameras and the like, the demand of low-cost and particularly high-density mass storage memories has increased dramatically. Therefore, one of the most important issues for low-cost and high-density MRAM-devices is a reduction of the MRAM-cell size.

In their simplest embodiment, an MRAM-configuration comprising memory cells in a memory matrix between bit and word lines, in a completely ideal manner require only an area of $4F^2$ per information content or bit, where F denotes the minimum feature size of the technology used. Such configuration, however, will suffer from considerable parasitic currents flowing through adjacent memory cells during read-out on account of the only slight differences in the resistance values of the memory cells. In order to avoid this disadvantage, more sophisticated configurations have already been envisaged, in which each individual memory cell contains an MTJ and an access (selection) transistor. What is disadvantageous about this configuration, however, is that the advantage of a high-density configuration is lost. More particularly, since the bottom electrode of each MTJ has to be connected to the corresponding selection transistor through a succession of vias, contacts and metal landing pads, and, on account of the fact, that these landing pads need to have a large contact area with respect to minimum feature size F, as has been shown, in practical realization, there is no possibility to achieve a memory cell size below an area of 20–25 $F^2$.

In order to resolve the above conflict between reduced area requirements in terms of minimum feature size F, on the one hand, and avoidance of parasitic currents, on the other hand, sharing of one selection transistor between several MTJs, for example, has been proposed. However, this solution may not be employed for MRAMs, since the storage signal cannot be mixed. Another solution, which has been previously proposed, envisages deep, especially self-aligned, vias running from the bottom electrode of the MTJ to the drain of the selection transistor, which, however, is a rather expensive technique, and, most likely will require long method development to be ready for mass fabrication.

In light of the above, there is a need for a resistive memory cell random access memory device allowing a further memory cell size down-scale as compared to conventional 1 access transistor/1 MTJ-arrangements, without having adverse effects as to parasitic (leaking) currents.

SUMMARY

Embodiments of the present invention provide a resistive memory cell random access device. In one embodiment, the present invention relates to a resistive memory cell random access memory device comprising a plurality of first current lines; a plurality of second current lines; a plurality of third current lines being formed as split current lines; and an array of resistive memory cells arranged in columns defined by said first current lines and rows defined by said third current lines, each resistive memory cell including a resistive memory element and an access transistor connected in series, each memory cell being connected between one of said first current lines and a reference potential, wherein said access transistors being FinFET-type field effect transistors, each one having two independent gates and a common floating body, and wherein each third current line being connected to one of said two independent gates of each one of the access transistors of a row of said array and being connected to one of said two independent gates of each one of the access transistors of an adjacent row of said array. It also relates to a method for its fabrication.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
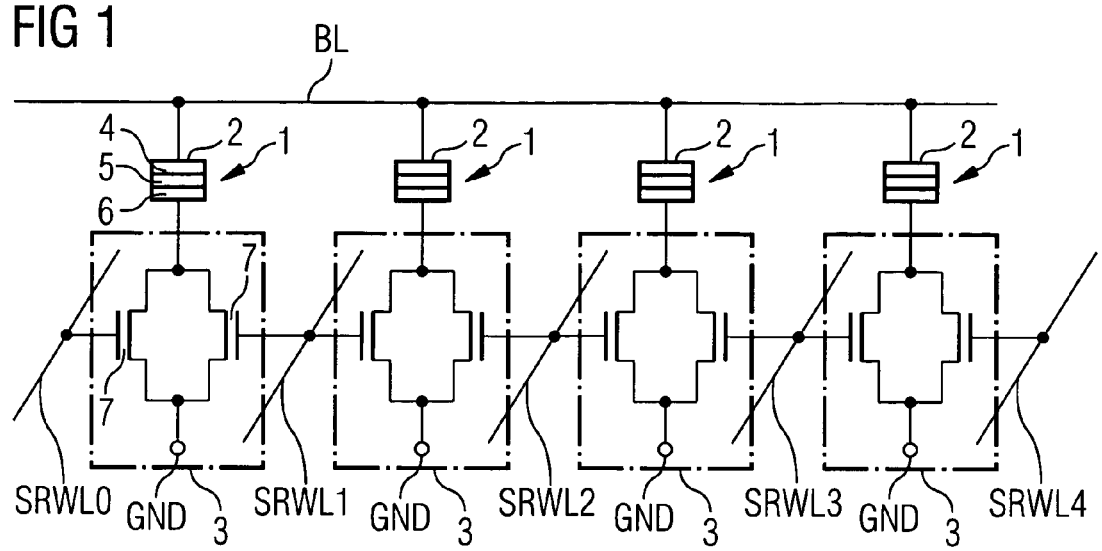
FIG. 1 is a schematic perspective partial view illustrating one embodiment of resistive memory cell random access memory device of the present invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the present invention provides resistive memory cell random access device, which comprises a plurality of first current lines, which may be identified by bit lines, a plurality of second current lines, which may be identified by write word lines, a plurality of third current lines, which are formed as split current lines and which may be identified by read word lines, and a plurality of resistive memory cells. The resistive memory cells are arranged in a memory matrix array, the columns of which are defined by the first current lines and the rows of which are defined by the third current lines and eventually second current lines. Each resistive memory cell typically includes a resistive memory element and an access transistor connected in series therewith, and, respective portions of the first, second and third current lines. The above series connection is connected between one of the first current lines and a reference potential, which may be chosen to be ground, particularly common ground. In other words, the access transistors are connected to the resistive memory elements by their drain-source paths.

According to embodiments of the invention the access transistors are formed as FinFET-type field effect transistors with two independent gates and a common floating body (sometimes also denoted as "independent double-gate"-transistors or "FinFET"-transistors). Using such independent double-gated FinFET-type transistors in the device of the invention, each third current line extending along a row of the memory matrix array is connected to one of the two independent gates of each one of the access transistors throughout a row, and, since it is formed as a split current line, is also connected to one of the two independent gates of each one of the access transistors of an adjacent row of the array. In other words, each third current line, which may be identified as read word line, is respectively connected to one of the gates of an adjacent pair of access transistors being provided on two adjacent rows along the same first current line, which may be identified as bit line, along the whole length of both adjacent rows. Hence, each one of the access transistors, that is to say its both gates are connected to two different third current lines. Turning-on the access transistors thus requires respective voltages applied to the two third current lines, which voltages have to be chosen sufficiently high to turn on the transistor.

The FinFET-type transistor used in the present invention is a sort of vertical SOI (silicon on isolator)-device, i.e., a double-gated MOSFET with a common floating body. This transistor may be considered favourable in many aspects. Firstly, this transistor is isolated from others. Secondly, the second gate of the symmetric gates can be used to modulate the threshold voltage of the first gate. More particularly, a voltage applied to the second gate will lower the threshold voltage of the first gate, i.e., helps to turn the first gate on, and vice-versa, turning-off of the second gate increases the threshold voltage of the first gate. By using two independent and identical gates and by appropriately choosing the physical characteristics, such as dimensions, doping profile and concentration, it thus is possible to obtain the following behaviour through a modulation of the threshold voltages: the FinFET-type transistor will be off, in case one or both gates are "low", i.e., a low voltage not enabling turning-on of the transistor, or even no voltage, is applied, and, the FinFET-type transistor will be on, in case both gates are "high", i.e., a high voltage is applied to the two gates enabling turning-on of the transistor. The above terms "high" or "low" are defined by the voltage values applied to the gates, which enable the FinFET-type transistor to be turned on or off, respectively. In other words, the half-selected cases, in which on only one of the gates of a single FinFET-type transistor a high voltage is applied, result in that the FinFET-type transistor is switched off, while the full-selected case, in which on both gates of a single FinFET-type transistor a high voltage is applied, results in that the FinFET-type transistor is switched on. Hence, in the half-selected cases no leakage currents will be obtained since the FinFET-type transistor remains off and there is no difficulty to sense on the first current line a single memory cell that is full-selected. This behaviour is based on the fact that the two gates of the FinFET-type transistor share one unique floating body, which cannot be the case with standard MOSFET transistors.

As can be gathered from the foregoing, "addressing" or "selecting" of a single resistive memory cell in above configuration is effected by the cumulative action of applying a high voltage to both third current lines, which may be identified by read word lines, which are connected to the gates of that resistive memory cell to be selected and read.

Throughout this specification, the term "resistive memory element" is used to describe resistive memory cells of any kind, which can be brought into two or more states exhibiting different electrical resistance values, such as magneto-resistive memory cells including magnetic tunnel junctions as used in convenient MRAMs, phase change memory cells using some sort of a phase change material and conductive bridging memory cells using some sort of a solid state electrolyte in combination with an ion donor electrode.

In case these memory cells are formed to be magneto-resistive memory cells, the resistive memory elements are formed as magnetic tunnel junctions, each one of which typically includes first and a second magnetic layers made of magnetic material stacked in parallel, overlying relationship and separated by a layer of nonmagnetic material, said second magnetic layer being provided with a magnetically fixed magnetization, while said first magnetic layer being provided with a free magnetization being free to be switched between the same and opposite directions with respect to the fixed magnetization direction of the second magnetic layer.

In one embodiment of the invention, the resistive memory elements, which, for instance, may be chosen to be magnetic tunnel junctions, are sandwiched in between the first and the second current lines for their magnetic field induced switching. It shall be noted, that only the first current lines are connected to the resistive memory elements, while the second current lines are not in contact therewith.

According to the invention it may be preferable that each resistive memory cell is located above the access transistor connected therewith. Particularly in that case, each access transistor may constitute a pillar extending perpendicular to the directions of first, second and third current lines. It then can possible, to realize each one of the resistive memory cells in $4F^2$ cell size, wherein F is the minimum feature size of the technique used.

According to another embodiment of the invention, a method for fabricating a resistive memory cell random access memory device according as above-described is provided.

The method comprises implanting into a monocrystal wafer of a first conductive type a laminated structure comprising a bottom layer of a second conductive type, a middle layer of the first conductive type and a top layer of the second conductive type, such that the upper surface of the top layer corresponds to the top surface of the wafer.

The laminated structure is structured by creating trenches, for example by etching, to a depth corresponding to the bottom surface of the middle layer to partition the middle and top layers of the laminated structure into a plurality of parallel first stripes extending into a first horizontal direction.

The first stripes are filled with an insulating material.

The laminated structure is structured by creating trenches, for example by etching, to a depth corresponding to the bottom surface of the middle layer to partition the middle and top layers of the laminated structure into a plurality of parallel second stripes extending into a second horizontal direction being perpendicular to the first horizontal direction in order to create a plurality of vertically extending pillars, each pillar comprising a part of said middle and top layers.

A gate oxide film is grown on the surfaces of the trenches of the second stripes.

The trenches of said second stripes are filled with a conductive material until a height corresponding to the top surface of the middle layer.

The trenches of the second stripes are eventually filled with an insulating material until a height corresponding to the top surface of the top layer.

A plurality of resistive memory elements are formed particularly magnetic tunnel junctions, a plurality of first and a plurality of second current lines on the top surface of said wafer.

In such method it may be preferred that the resistive memory elements are formed above the pillars. It may also be preferred if the conductive material is chosen to be polysilicon.

Embodiments of the present invention provide a resistive memory cell random access memory device that allows further memory cell size down-scale as compared to conventional access transistor/1 MTJ-arrangements, without having adverse effects as to parasitic.

Now referring to FIG. 1, an embodiment of a resistive memory cell random access memory device of the invention comprising magneto-resistive memory cells 1 in a memory matrix form, wherein the first current lines define the columns of the memory matrix, while the second or third current lines define its rows, is explained. Based on a conventional MRAM-configuration, each memory cell 1 of the invention's device comprises a magnetic tunnel junction (MTJ) 2 and an access transistor 3 (shown by dashed lines) connected therewith in a series connection, as well as respective portions of first, second and third current lines. Each MTJ 2 includes free 4 and reference 6 layers made of a magnetic material stacked in parallel, overlying relationship and separated by a layer of nonmagnetic material 5. The magnetization of the free layer is magnetically coupled to a bit line (BL) above the corresponding MTJ and a write word line (not illustrated in FIG. 1) below that MTJ for its switching in a parallel or antiparallel state with respect to the magnetization of the reference layer. Bit lines and write word lines are crossing at right angles, while each one of the MTJs is positioned at their intersections. The bit lines generate a first magnetic field in case a current is sent therethrough. Also, write word lines generate a second magnetic field in case a current is sent therethrough. Both magnetic fields mutually act on the easy axis magnetization of the MTJ positioned at the intersection of the corresponding bit and write word lines, respectively, for its switching.

In FIG. 1 each one of the memory cells comprised of MTJ 2 and access transistor 3 is electrically connected to a same bit line (BL), while the access transistor 3 is connected to ground (GND), which may be a common ground. Each one of the read word lines (SRW0, SRWL1, SRWL2, SRWL3, SRWL4), being perpendicular to the BL and being formed as split current lines, is respectively connected to one gate of an adjacent pair of access transistors 3 connected to the same BL. Hence, the two gates of each access transistor 3 are connected to two different read word lines. In a full memory matrix array, each split read word line thus is connected to the gates (i.e., one gate of one transistor and one gate of the other transistor of an adjacent pair) of a plurality of adjacent pairs of access transistors along two adjacent rows for the switching-on or -off of selected access transistors for the sensing of the memory cells 1. As above explained, switching-on of a single access transistors for sensing the resistance values (logic states) of the MTJ 2 connected therewith requires a full-select state with high voltage applied to both of the gates of that access transistor, while any half-select states (at least on one gate of a single access transistor a low voltage is applied) will result in turning-off of that access transistor.

Now referring to FIGS. 2 through 5, one embodiment of a fabrication method for a resistive memory cell random access memory device of the present invention as shown in FIG. 1 is explained. The device is a vertical N-channel device with the source built with a buried $N^+$-implant, normally existing in N-well areas to prevent latch-up. Here the implant is done into a P-well area. The drain is made with the normal surface $N^+$-implant.

Figure 2:
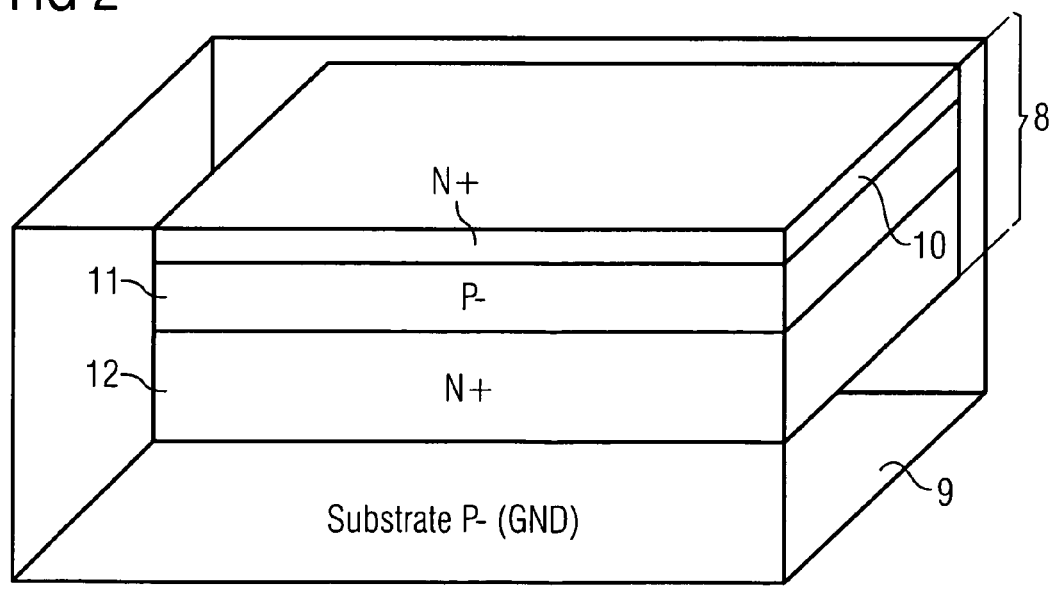
FIG. 2 illustrates a first step of a fabrication method for a resistive memory cell random access memory device of the present invention as shown in FIG. 1.

As illustrated in FIG. 2, a laminated structure 8 is implanted into a part of a mono-crystal semiconductor wafer 9 (substrate) of a first conductive type ($P^-$-type). The substrate 9 serves as a common ground. The laminated structure 8 includes a bottom layer 12, which is of a second conductive type ($N^+$-type), a middle layer 11 which is of the first conductive type ($P^-$type), and a top layer 10, which is of the second conductive type ($N^+$-type). The laminated structure 8 may be generated by respective doping processes.

Figure 3:
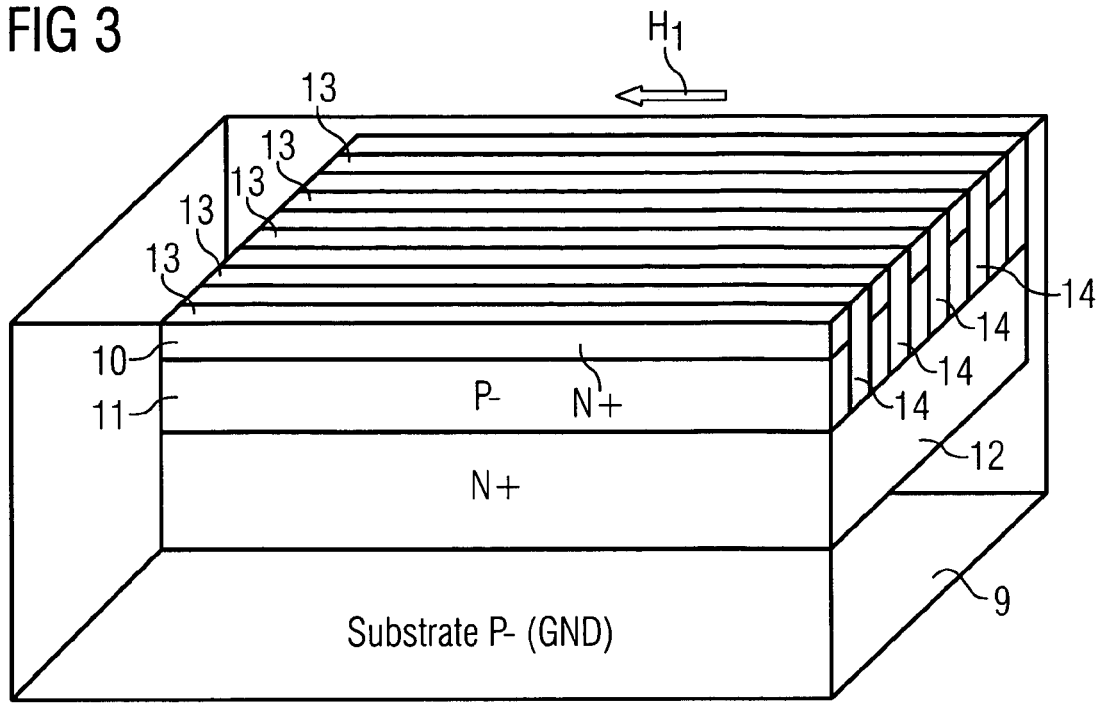
FIG. 3 illustrates a second step of a fabrication method for a resistive memory cell random access memory device of the present invention as shown in FIG. 1.

As illustrated in FIG. 3, the laminated structure 8 is structured by using for instance etching processes such that a plurality of parallel first stripes 13 are obtained, which respectively extend in a first horizontal direction ($H_1$). The structuring depth is chosen such that the resulting trench depths between the parallel first stripes 13 reach to the vertical position of the bottom surface of the middle layer 11 (corresponds to the top surface of the bottom layer 12), so that the parallel first stripes 13 are only connected via bottom layer 12 with each other. The trenches between the parallel first stripes 13 then are filled with an insulating material 14, such as an oxide material.

Figure 4:
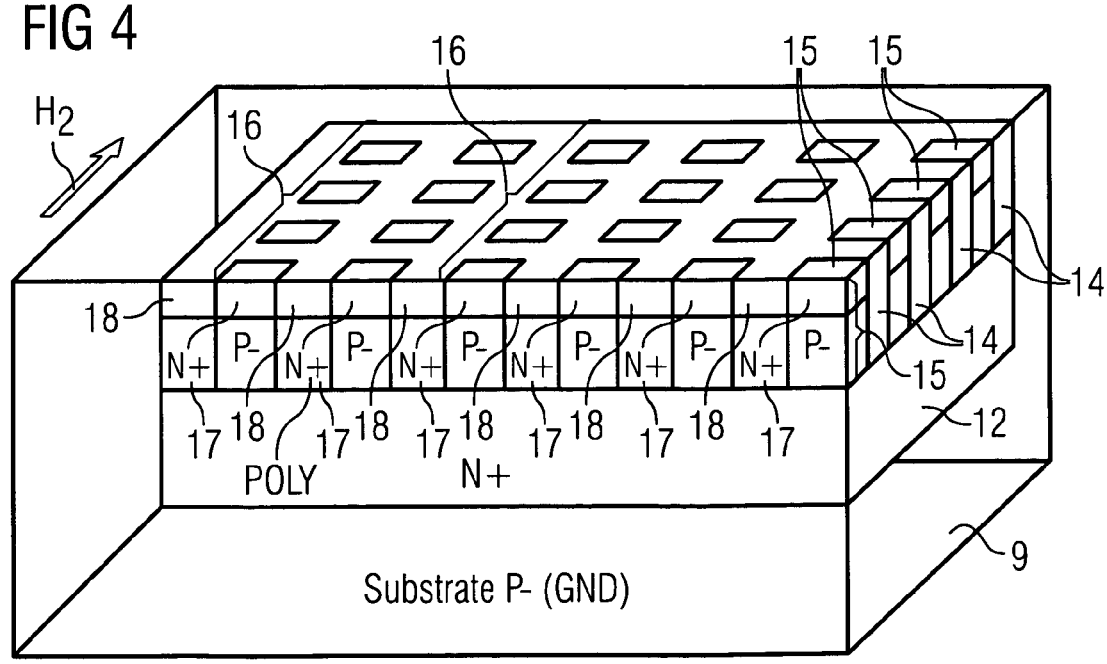
FIG. 4 illustrates a third step of a fabrication method for a resistive memory cell random access memory device of the present invention as shown in FIG. 1.

As shown in FIG. 4, the laminated structure 8 is structured by using for instance etching processes such that a plurality of parallel second stripes 16 are obtained, which respectively extend in a second horizontal direction ($H_2$) being perpendicular to the first horizontal direction ($H_1$). The structuring depth is chosen such that the resulting trench depths between the parallel second stripes 16 reach to the vertical position of the bottom surface of the middle layer 11 (corresponds to the top surface of the bottom layer 12), so that the parallel second stripes 16 are only connected via bottom layer 12 with each other. By structuring the second stripes 16 crossing the first stripes 13 at right angles, a plurality of vertically extending pillars 15 (not standing free) is obtained, wherein each pillar 15 comprises a part of the top layer 10 and the middle layer 11.

Afterwards, a gate oxide film is grown on the surfaces of the trenches between the second stripes 16. Then, the trenches between the parallel second stripes 16 are filled with a conductive material 17, such as poly-silicon, until a height corresponding to the top surface of the middle layer 11 (corresponds to the bottom surface of the top layer 10) is reached. The conductive material 17 between the middle layer parts of the second stripes 16 serves as split read word lines. Then, the trenches between the parallel second stripes 16 should be filled with an insulating material 18, such as an oxide material, until a height corresponding to the top surface of the top layer 11 (corresponds to the surface of the wafer substrate 9) is reached, as a contact needs to be placed on top of each $N^+$-island to connect the resistive memory element, for instance magnetic tunnel junction.

Otherwise, a serious risk of a short-cut between the conductive material 17 and the contact may be expected.

The embodiment shown in FIG. 4 may serve as a "basis" of the embodiments of a resistive memory cell random access memory device, particularly MRAM-device, according to the invention.

Figure 5:
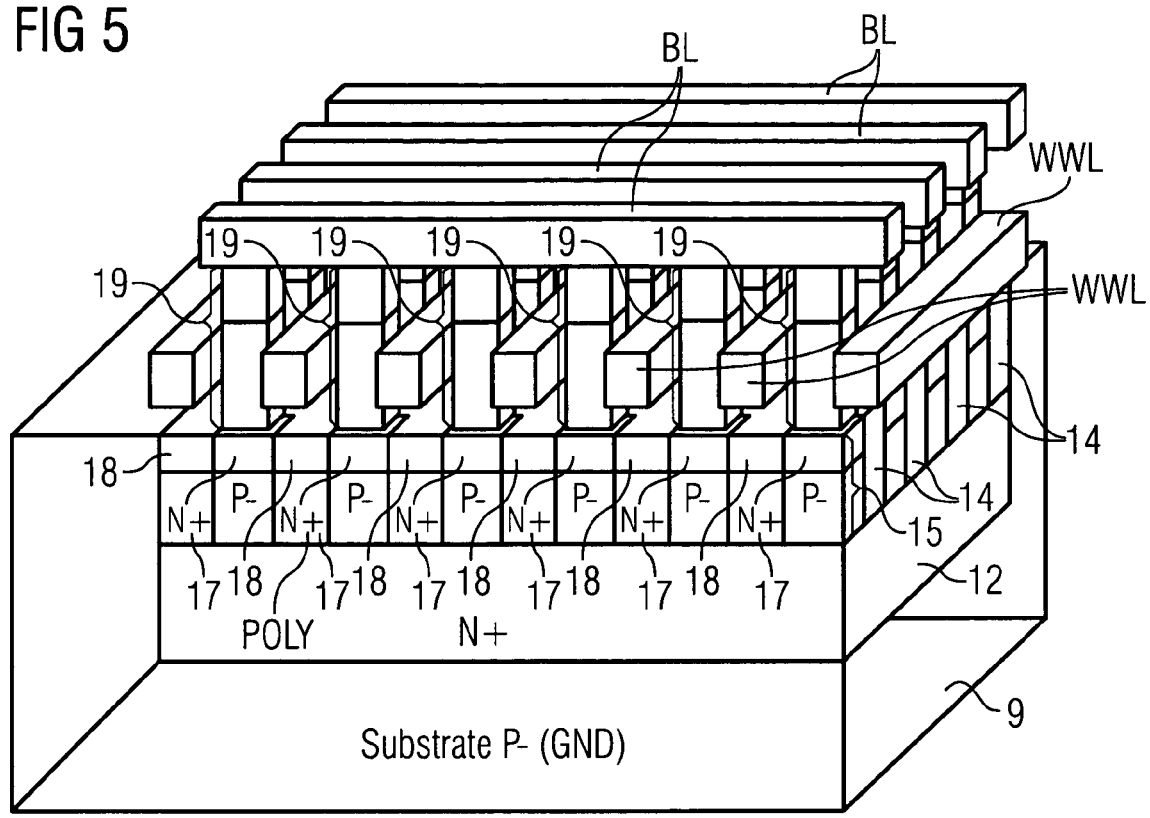
FIG. 5 illustrates a fourth step of a fabrication method for a resistive memory cell random access memory device of the present invention as shown in FIG. 1.

In FIG. 5, a plurality of resistive memory elements in the form of stacked magnetic tunnel junctions 19, respectively provided above the pillars 15 is formed. Also, write word lines (SWRL) are formed between the stacked MTJs 19, and, bit lines (BL) are formed above the MTJs 19 crossing the write word lines at right angles.

The present invention solves the above and further objects. In its layout realization, it is possible to use the same process flow as in the fabrication of prior art resistive memory cell configurations. However, instead of being limited in the memory cell size to 20–25 $F^2$ due to selection transistor limitations, as above-described, the resistive memory cells connected to a single access transistor will end up with a minimum area per memory cell of as small as 4 $F^2$. Further, as an advantage, parasitic currents in the unselected memory cells advantageously can be avoided.

In conclusion: A vertical "independent-double-gated" FinFET transistor that can meet the $4F^2$-requirement for density has been defined. It can offer much performance such as removing leakage currents along the read path (metal bit line on one end and direct substrate connection without wiring on the other end). As most of these parasitics are cancelled, higher speeds and lower consumption can be expected. A useful advantage compared to the prior art diode solution is, that there is no need to polarize the memory cell over the diode threshold. Much lower read conditions can be applied limiting once again the power consumption. Similar approach can be done using vertical junction field effect transistors, assuming that it is still possible to define thin burier $P^+$-lines instead of the poly-silicon (the body of the junction field effect transistor being $N^-$ in this case).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A resistive memory cell random access memory device comprising:
   a plurality of first current lines;
   a plurality of second current lines;
   a plurality of third current lines being formed as split current lines; and
   an array of resistive memory cells arranged in columns defined by the first current lines and rows defined by the third current lines, each resistive memory cell including a resistive memory element and an access transistor connected in series, each memory cell being connected between one of the first current lines and a reference potential, wherein the access transistors being FinFET-type field effect transistors, each one having two independent gates and a common floating body, and wherein each third current line being connected to one of the two independent gates of each one of the access transistors of a row of said array and being connected
to one of the two independent gates of each one of the
access transistors of an adjacent row of the array;
wherein the first current lines being bit lines, the second
current lines being write word lines, and the third
current lines being word lines.

2. A resistive memory cell random access memory device
comprising:
a plurality of first current lines;
a plurality of second current lines;
a plurality of third current lines being formed as split
current lines; and
an array of resistive memory cells arranged in columns
defined by the first current lines and rows defined by the
third current lines, each resistive memory cell including
a resistive memory element and an access transistor
connected in series, each memory cell being connected
between one of the first current lines and a reference
potential, wherein the access transistors being FinFET-
type field effect transistors, each one having two inde-
pendent gates and a common floating body, and
wherein each third current line being connected to one
of the two independent gates of each one of the access
transistors of a row of said array and being connected
to one of the two independent gates of each one of the
access transistors of an adjacent row of the array;
wherein the first current lines being bit lines, the second
current lines being write word lines, and the third
current lines being word lines.

3. The device of claim 2, wherein the resistive memory
elements are magnetic tunnel junctions including first and a
second magnetic layers made of magnetic material stacked
in parallel, overlying relationship and separated by a layer of
nonmagnetic material, the second magnetic layer being
provided with a magnetically fixed magnetization, while the
first magnetic layer being provided with a free magnetiza-
tion being free to be switched between the same and
opposite directions with respect to the fixed magnetization
direction of the second magnetic layer.

4. A resistive memory cell random access memory device
comprising:
a plurality of first current lines;
a plurality of second current lines;
a plurality of third current lines being formed as split
current lines; and
an array of resistive memory cells arranged in columns
defined by the first current lines and rows defined by the
third current lines, each resistive memory cell including
a resistive memory element and an access transistor
connected in series, each memory cell being connected
between one of the first current lines and a reference
potential, wherein the access transistors being FinFET-
type field effect transistors, each one having two inde-
pendent gates and a common floating body, and
wherein each third current line being connected to one
of the two independent gates of each one of the access
transistors of a row of said array and being connected
to one of the two independent gates of each one of the
access transistors of an adjacent row of the array;
wherein the first current lines being bit lines, the second
current lines being write word lines, and the third
current lines being word lines.

5. The device of claim 1, wherein the resistive memory
elements are sandwiched in between said first and second
current lines.

6. A resistive memory cell random access memory device
comprising:
a plurality of first current lines;
a plurality of second current lines;
a plurality of third current lines being formed as split
current lines; and
an array of resistive memory cells arranged in columns
defined by the first current lines and rows defined by the
third current lines, each resistive memory cell including
a resistive memory element and an access transistor
connected in series, each memory cell being connected
between one of the first current lines and a reference
potential, wherein the access transistors being FinFET-
type field effect transistors, each one having two inde-
pendent gates and a common floating body, and
wherein each third current line being connected to one
of the two independent gates of each one of the access
transistors of a row of said array and being connected
to one of the two independent gates of each one of the
access transistors of an adjacent row of the array;
wherein the first current lines being bit lines, the second
current lines being write word lines, and the third
current lines being word lines.

7. The device of claim 1, wherein the each one of the
resistive memory elements is located above the access
transistor connected therewith.

8. A resistive memory cell random access memory device
comprising:
a plurality of first current lines;
a plurality of second current lines;
a plurality of third current lines being formed as split
current lines; and
an array of resistive memory cells arranged in columns
defined by the first current lines and rows defined by the
third current lines, each resistive memory cell including
a resistive memory element and an access transistor
connected in series, each memory cell being connected
between one of the first current lines and a reference
potential, wherein the access transistors being FinFET-
type field effect transistors, each one having two inde-
pendent gates and a common floating body, and
wherein each third current line being connected to one
of the two independent gates of each one of the access
transistors of a row of said array and being connected
to one of the two independent gates of each one of the
access transistors of an adjacent row of the array;
wherein the first current lines being bit lines, the second
current lines being write word lines, and the third
current lines being word lines.

9. A resistive memory cell random access memory device
comprising:
a plurality of first current lines;
a plurality of second current lines;
a plurality of third current lines being formed as split
current lines; and
an array of resistive memory cells arranged in columns
defined by the first current lines and rows defined by the
third current lines, each resistive memory cell including
a resistive memory element and an access transistor
connected in series, each memory cell being connected
between one of the first current lines and a reference
potential, wherein the access transistors being FinFET-
type field effect transistors, each one having two inde-
pendent gates and a common floating body, and
wherein each third current line being connected to one
of the two independent gates of each one of the access
transistors of a row of said array and being connected to one of the two independent gates of each one of the access transistors of an adjacent row of the array;

wherein the first current lines being bit lines, the second current lines being write word lines, and the third current lines being word lines.

10. The device of claim 9, wherein the reference potential is ground.

11. The device of claim 9, wherein the resistive memory elements are sandwiched in between said first and second current lines; and wherein the second current lines are located above the third current lines.

12. The device of claim 11, wherein the each one of the resistive memory elements is located above the access transistor connected therewith; and wherein the access transistors constitute pillars extending perpendicular to the directions of first, second and third current lines.

* * * * *